United States Patent [19]

Yoshikawa

[11] Patent Number: 5,176,783

[45] Date of Patent: Jan. 5, 1993

[54] SEMICONDUCTOR SUBSTRATE ETCHING APPARATUS

[75] Inventor: Kiyoshi Yoshikawa, Kawasaki, Japan

[73] Assignee: Kabushiki Kaisha Toshiba, Kawasaki, Japan

[21] Appl. No.: 758,109

[22] Filed: Sep. 12, 1991

[30] Foreign Application Priority Data

Sep. 14, 1990 [JP] Japan .................................. 2-245396

[51] Int. Cl.⁵ ........................ H01L 21/306; B44C 1/22
[52] U.S. Cl. .................................. 156/345; 156/662; 156/626; 29/25.01
[58] Field of Search ............... 156/626, 627, 639, 640, 156/657, 662, 345; 134/26, 33, 95, 134, 144, 198

[56] References Cited

U.S. PATENT DOCUMENTS 4,968,375 11/1990 Sato et al. ............................ 156/345

FOREIGN PATENT DOCUMENTS 0368334 5/1990 European Pat. Off. .
0385590 9/1990 European Pat. Off. .
3917895 12/1989 Fed. Rep. of Germany .

Primary Examiner—William A. Powell
Attorney, Agent, or Firm—Foley & Lardner

[57] ABSTRACT

A semiconductor substrate etching apparatus for etching a tapered outer circumferential surface of a semiconductor substrate. A semiconductor substrate supply unit, an X-Y stage unit, an etchant applying unit, a cleaning unit, a baking unit, and a semiconductor substrate recovering unit are arranged in a horizontal plane in the described order. Semiconductor substrates are sequentially transferred by a transfer mechanism from the semiconductor substrate supply unit to the semiconductor substrate recovering unit in the described order. A control unit controls the transfer mechanism to perform the transferring of the semiconductor substrate, and controls the X-Y stage unit in response to a position detection signal, outputted from a position detector, for positioning the semiconductor substrate on the X-Y stage unit.

5 Claims, 4 Drawing Sheets

SEMICONDUCTOR SUBSTRATE ETCHING APPARATUS

BACKGROUND OF THE INVENTION

The present invention relates to a semiconductor substrate etching apparatus, and particularly relates to a semiconductor substrate etching apparatus for automatically etching a beveled outer edge of a semiconductor substrate (also referred to as a wafer) having a bevel structure.

A disk-shaped semiconductor substrate having no orientation flat is adopted as a wafer for a large-power semiconductor device. Most of the semiconductor substrates are tapered or beveled at edges thereof to maintain predetermined breakdown voltages. During beveling, cracks and defects are produced in the beveled edge of the wafer, and must be removed by etching the beveled edge.

The etching of the beveled edge of the wafer is conventionally achieved by the following processing. As illustrated in FIG. 5, one major surface of a semiconductor substrate 1 is entirely coated with an antietchant 2 with a brush, and then the semiconductor substrate 1 is bonded to a fluoroplastic disk 3 having the same diameter as the semiconductor substrate 1. Thereafter, the semiconductor substrate 1 is placed on a hot plate 4 through the fluoroplastic disk 3 for baking for several minutes so that the semiconductor substrate 1 and the fluoroplastic disk 3 are adhered to each other. After baking, the other major surface or the pattern formation surface is coated with an antietchant 5 by a brush, and is then similarly baked. Care should be taken not to apply the antietchant to the beveled edge 1a during the antietchant applying operations.

The semiconductor substrate 1 attached to the fluoroplastic disk 3 as illustrated in FIG. 5 is picked up by a tweezers 6, and is immersed in an etchant 7 for a predetermined time to etch only the beveled edge of the semiconductor substrate 1. After etching, the semiconductor substrate 1 is cleaned with water, and is then immersed in a boiling organic solution to peel off the fluoroplastic disk 3 from the semiconductor substrate 1 as well as to remove antietchant 2 and 5. Thereafter, the semiconductor substrate 1 is washed in a water flow. After washing, the semiconductor substrate 1 is dried by an infrared lamp 8.

Such an earlier attempt however raised the following problems: great care should be taken to apply antietchant on the opposite major surfaces of the semiconductor substrate 1 so that the antietchant may not adhere to the beveled edge 1a of the semiconductor substrate 1; a fluoroplastic disk 3 must be bonded to one major surface of the semiconductor substrate 1; removal of the antietchant is needed with the accompanying cleaning and drying operations; a considerable drop in yield of the semiconductor substrate 1 due to nonuniform coating of antietchant 2 and 5; the consumption of the etchant is rather increased since the whole wafer is immersed in the etchant for etching only the beveled edge 1a of the semiconductor substrate 1.

Another attempt to overcome such problems is disclosed in Japanese unexamined patent publication (Kokai) 1(1989)-316936. The semiconductor substrate etching apparatus of this publication is, as shown in FIGS. 8 and 9, provided with a rotary table 9 with a vacuum chuck, and an applying roller 11 with a rotary shaft 10, the roller 11 being disposed in parallel with the rotary table 9. An etchant 13 is supplied from an etchant supply nozzle 12 to an outer circumferential groove 11a of the applying roller 11. A semiconductor substrate 1 is vacuum chucked by the rotary table 9, and the beveled edge 1a fits into the outer circumferential groove 11a of the applying roller 11. With such a construction, the etchant 13 is supplied from the etchant supplying nozzle 12 to the outer circumferential groove 11a of the applying roller 11 while the rotary table 9 and the applying roller 11 are rotated. The etchant 13 is held in the outer circumferential groove 11a due to surface tension, and adheres to the beveled edge of the semiconductor substrate 1 for etching as the applying roller 11 is rotated. After completion of the etching of the whole edge of the semiconductor substrate 1, the supply of the etchant is discontinued, and then pure water is jetted from cleaning nozzles 14 and 15 to clean the semiconductor substrate 1. Finally, the semiconductor substrate 1 is rotated at a high speed for drying.

The semiconductor substrate etching apparatus taught in the Japanese unexamined patent publication 1-316936 is disadvantageous in the following points: it automatizes only the applying of the etchant to the beveled edge of the semiconductor substrates and the subsequent washing, and does not automate the whole line of the etching processing including transferring of semiconductor substrates, applying of the etchant, cleaning with water, baking, etc; and nonuniform coating of the etchant takes place if the semiconductor substrate 1 is eccentrically placed on the rotary table 9.

SUMMARY OF THE INVENTION

Accordingly, it is an object of the present invention to provide a semiconductor substrate etching apparatus which is capable of uniformly applying an etchant over the whole edge of a semiconductor substrate, and enables automatization of the whole line of the etching processing of the semiconductor substrate, including transferring of semiconductor substrates, applying of the etchant, cleaning with water, baking, etc.

In view of this and other objects in view the present invention provides a semiconductor substrate etching apparatus for etching a beveled outer edge of a semiconductor substrate, comprising: a semiconductor substrate supply means for placing a tray, receiving a semiconductor substrate, therein; registration means for registering a semiconductor substrate transferred from the semiconductor substrate supply means thereto, the registration means including: X-Y stage means for resting the semiconductor substrate transferred from the semiconductor substrate supply means thereon for positioning in an x-y coordinate system; and position detecting means for detecting a position in the x-y coordinate system of the semiconductor substrate rested on the X-Y stage means to produce a position detection signal; etchant applying means including: a rotary table means for resting the semiconductor substrate, transferred from the registration means, thereon for rotation; and etchant applying means, arranged in the vicinity of the rotary table means, for applying an etchant to the tapered outer edge of the semiconductor substrate rested on the rotary table means; cleaning means for cleaning the semiconductor substrate transferred from the rotary table means thereto and for drying the cleaned semiconductor substrate; baking means including: hot plate means for resting a cleaned and dried semiconductor substrate, transferred from the cleaning means, thereon and for baking the cleaned and dried semiconductor substrate for drying; semiconductor substrate recovering means for resting a tray to receive the baked semiconductor substrate, transferred from the baking means, thereon, the semiconductor substrate supply means, the X-Y stage means, the etchant applying means, the cleaning means, the baking means, and the semiconductor substrate recovering means being arranged in a horizontal plane in the described order; transfer means for sequentially transferring the semiconductor substrate in the described order from the semiconductor substrate supply means to the semiconductor substrate recovering means; and control means for controlling the transfer means to perform the transferring of the semiconductor substrate and for controlling the X-Y stage means in response to the position detection signal for positioning the semiconductor substrate on the X-Y stage means.

According to the present invention, semiconductor substrates are sequentially transferred from the semiconductor substrate supply means to the semiconductor substrate recovering means by the transfer means, and etching is automatically conduced. The processing time is thus greatly reduced. Furthermore, the semiconductor substrates are placed on the rotary table means of the etchant applying means at a relatively high accuracy since this operation is carried out after the semiconductor substrates are registered by the X-Y stage means. This enables the etchant to be applied more uniformly than the techniques according to the prior art, and the semiconductor substrate etching apparatus of the present invention is fairly enhanced in yield.

DETAILED DESCRIPTION OF THE PREFERRED EMBODIMENTS

Figure 1:
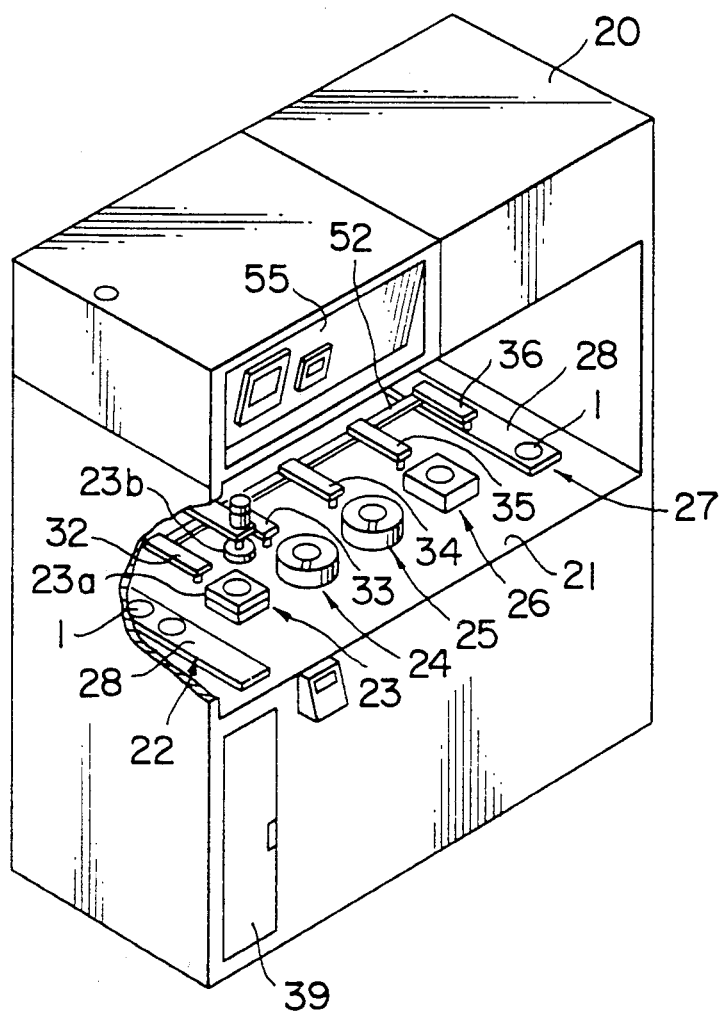
FIG. 1 is a perspective view of a semiconductor substrate etching apparatus constructed according to the present invention.

A semiconductor substrate etching apparatus according to the present invention will be described with reference to FIGS. 1 to 4, in which parts corresponding to parts in FIGS. 5 to 9 are designated by the same reference numerals, and descriptions thereof are omitted or simplified.

Figure 2:
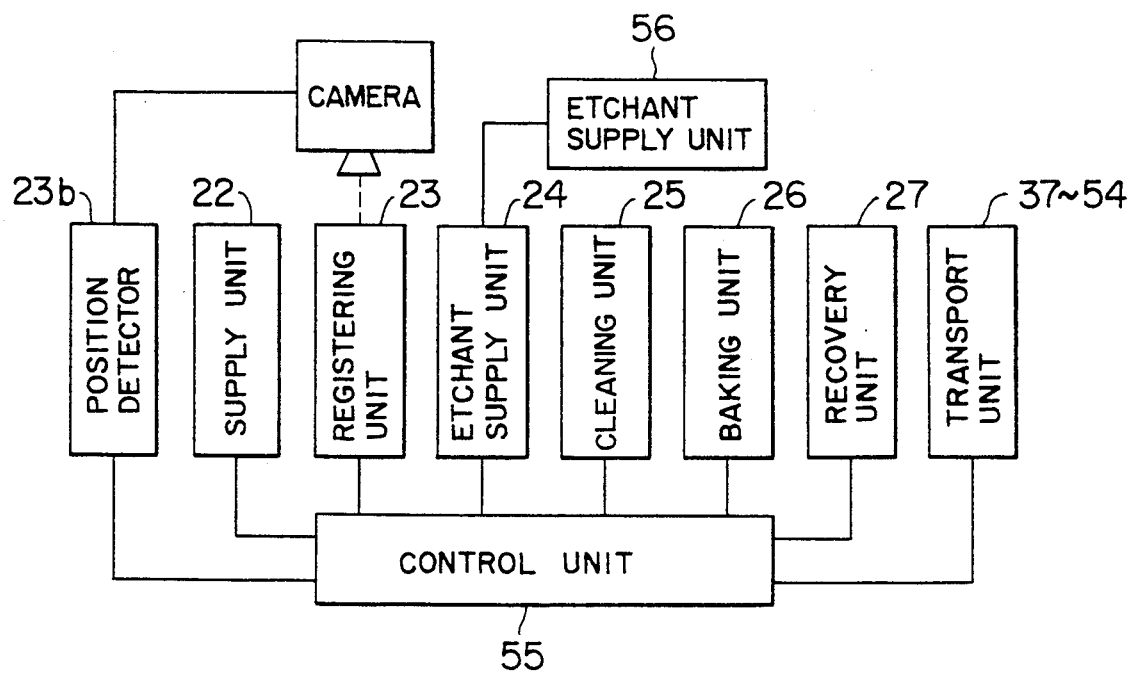
FIG. 2 is a block diagram illustrating how to operate the semiconductor substrate etching apparatus of FIG. 1.

In FIGS. 1 and 2, a clean unit 20 is provided with a base 21, on which a semiconductor substrate supply unit 22, a registering unit 23, an etchant applying unit 24, a cleaning unit 25, a baking unit 26 having a hot plate 26a and a semiconductor substrate recovery unit 27 are substantially longitudinally aligned in a horizontal plane in the described order. The semiconductor substrate supply unit 22 has trays 28 each of which is adapted to receive semiconductor substrates 1 at predetermined positions. The registering unit 23 includes an X-Y stage 23a and a position detector 23b which includes an industrial television camera arranged above the X-Y stage 23a.

Figure 4:
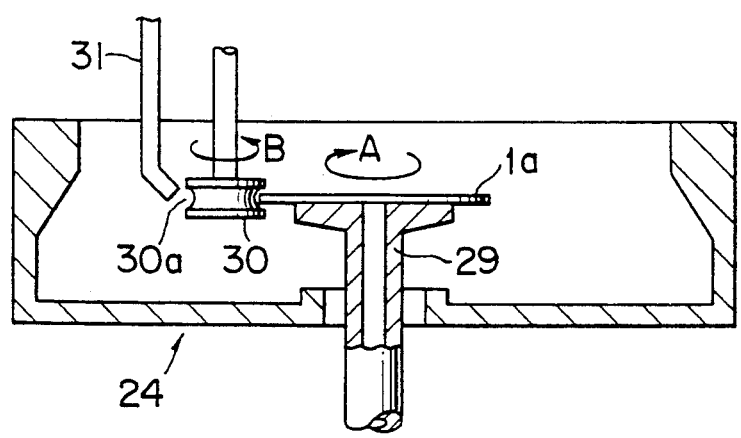
FIG. 4 is an enlarged axial sectional view of the etchant applying unit of FIG. 1.
Figure 8:
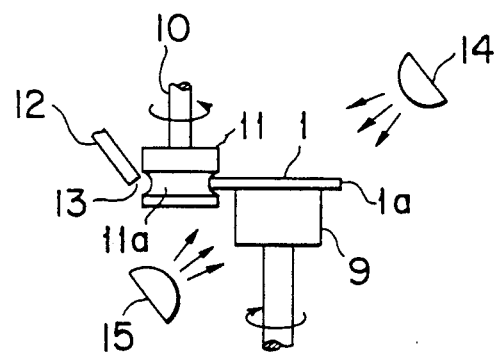
FIGS. 8 and 9 are diagrammatic front and plan views of another conventional semiconductor substrate etching apparatus.
Figure 9:
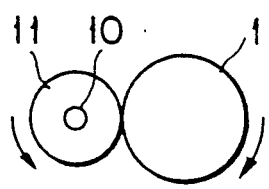

The etchant applying unit 24 has a construction similar to the semiconductor substrate etching apparatus disclosed in the Japanese unexamined patent publication 1-316936, that is, in FIGS. 8 and 9. As shown in FIG. 4, the etchant applying unit 24 includes a rotary table 29 with a vacuum chuck function, the rotary table 29 being connected to a motor, not shown for rotation. The etchant applying unit 24 is further provided with an applying roller 30, connected to another motor also not shown, and an etchant feed tube 31 for supplying an etchant to the applying roller 30. The applying roller 30 and the etchant feed tube 31 are constructed so that they may be moved in unison toward and away from the rotary table 29.

Figure 3:
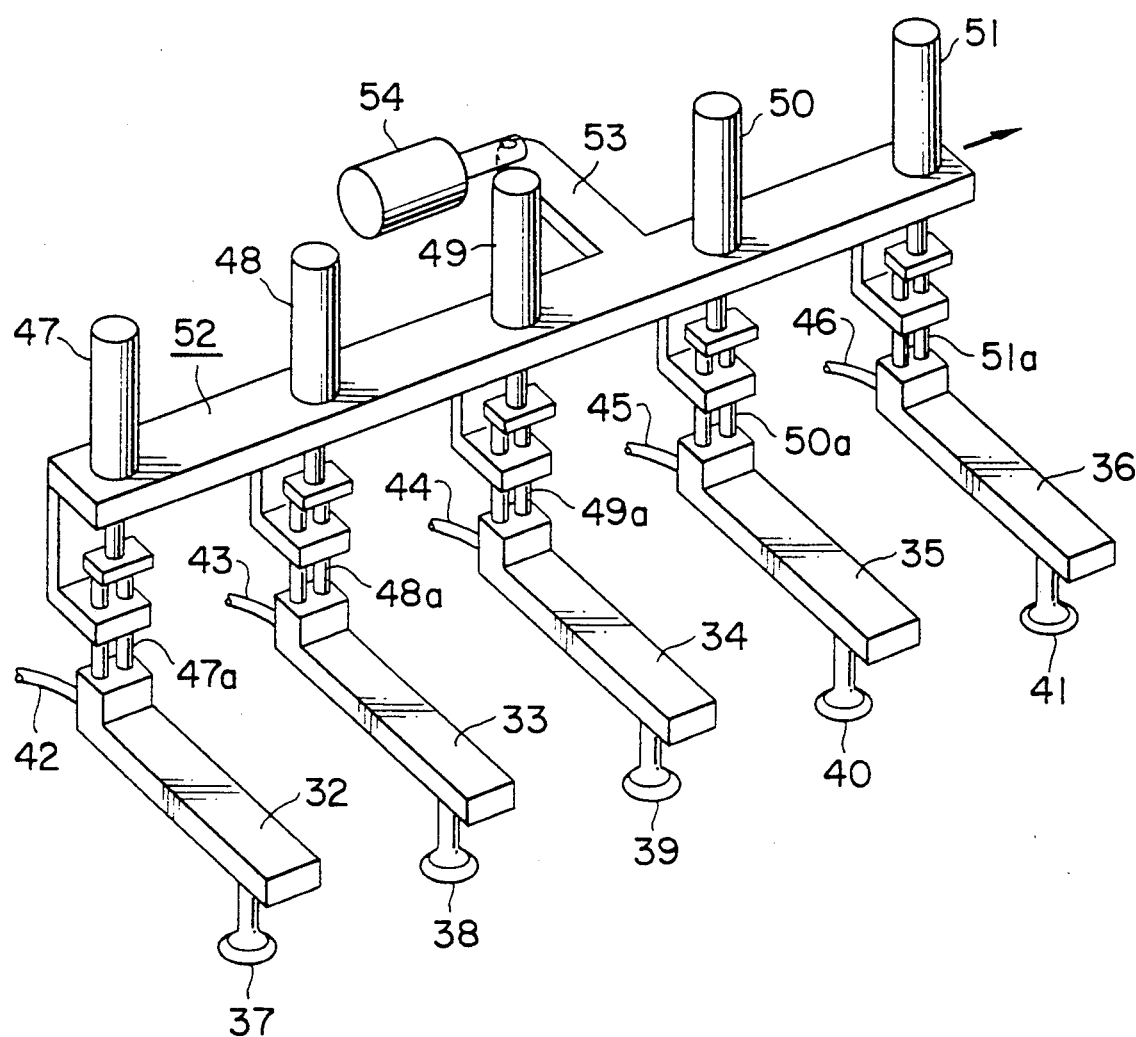
FIG. 3 is an enlarged perspective view of the reciprocal arm in FIG. 1.
Figure 5:
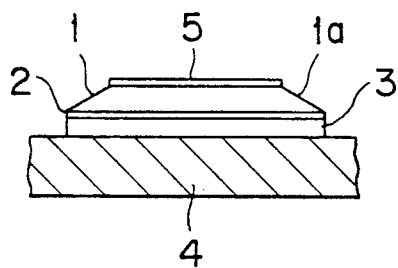
FIGS. 5 to 7 illustrate the conventional technique of etching a semiconductor substrate.
Figure 6:
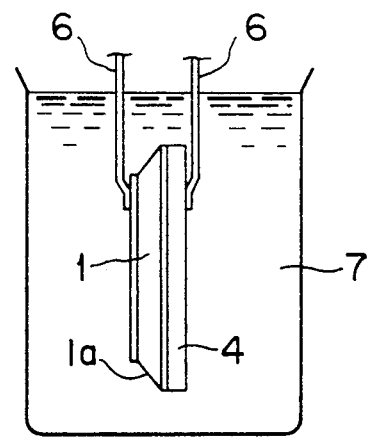
Figure 7:
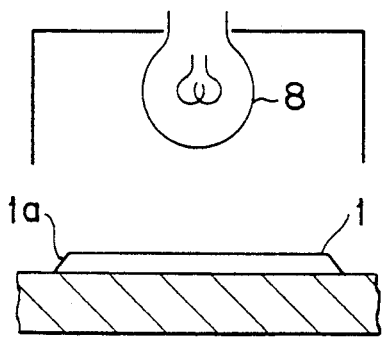

Just above the semiconductor substrate supply unit 22, the registering unit 23, the etchant applying unit 24, the cleaning unit 25, the baking unit 26 and the semiconductor substrate recovery unit 27, there are arranged first to fifth transport arms 32, 33, 34, 35 and 36, respectively. As shown in FIG. 3, the transport arms 32, 33, 34, 35 and 36 have vacuum chuck heads 37 to 41, which are communicated to flexible hoses 42 to 46 to a vacuum pump unit not shown, respectively. The transfer arms 32 to 36 are attached at rear ends thereof to distal ends of piston rods 47a to 51a of pneumatic cylinders 47 to 51, respectively. The pneumatic cylinders 47 to 51 are vertically secured to a reciprocal arm 52 so that the transfer arms 32 to 36 are equispaced, 30 cm in this embodiment. The reciprocal arm 52 is supported on the frame of the clean unit 20 for horizontal movement. The reciprocal arm 52 is horizontally reciprocally moved by a horizontal movement pneumatic cylinder 54, mounted on the frame of the cleaning unit, through a lug 53 thereof at a predetermined stroke, 30 cm in this embodiment.

The first transfer arm 32 vacuum chucks a semiconductor substrate 1, which is in the semiconductor supply unit 22, by the vacuum chuck head 37, and transfers the semiconductor substrate 1 onto the X-Y stage 23a of the registering unit 23. The second transfer arm 33 vacuum chucks a semiconductor substrate 1, which is on the X-Y stage 23a, by the vacuum chuck head 38, and carries the semiconductor substrate 1 onto the rotary table 29 (FIG. 4) of the etchant applying unit 24. The third transfer arm 34 sucks a semiconductor substrate 1 from the rotary table 29 by the vacuum chuck head 39, and transfers the semiconductor substrate 1 to the cleaning unit 25. The fourth transfer arm 35 vacuum chucks a semiconductor substrate 1 in the cleaning unit 25 by the vacuum chuck head 40, and transfers it to the baking unit 26. The fifth transfer arm 36 vacuum chucks a semiconductor substrate 1 in the baking unit 26 by the vacuum chuck head 41, and carries it onto a tray 28 placed in the semiconductor recovery unit 27. To prevent the etchant applied surface of every semiconductor substrate 1 from being damaged during transfer, the vacuum chuck heads 37 to 41 of the third to the fifth transfer arms 32 to 36 are formed so that each of the contact edges thereof makes a contact only with a central part of each semiconductor substrate 1 and does not make a contact with the peripheral portion thereof. More specifically, for this purpose each of the vacuum chuck heads 37 to 41 of the third to the fifth transfer arms 32 to 36 is formed to be sufficiently smaller in diameter than the semiconductor substrate 1 or has a circumferential groove formed at a portion thereof corresponding to the outer periphery of the semiconductor substrate 1.

The clean unit 20 has a control unit 55 for controlling each unit thereof, and an etchant supply unit 56 incorporated in it.

In operation, a tray 28 in which semiconductor substrates 1 are received is placed in the semiconductor substrate supply unit 22. After one of the semiconductor substrates 1 on the tray 28 is vacuum chucked and held by the vacuum chuck head 37, the pneumatic cylinder 47 is actuated, so that the first transfer arm 32 is raised 10 cm, in this embodiment, with the semiconductor substrate 1. Then, the pneumatic cylinder 54 is actuated to move the reciprocal arm 52 30 cm in a direction indicated by the arrow in FIG. 3, after which the pneumatic cylinder 47 is deactivated to place the semiconductor substrate 1 on the X-Y stage 23a of the registering unit 23. Then, the pneumatic cylinder 54 is deactivated to return the reciprocal arm 52 to the original position shown in FIG. 1. The position detector 23b detects marks (not shown) of the peripheral portion and the central portion of the semiconductor substrate 1 placed on the X-Y stage 23a to produce a detection signal, according to which the control unit 55 computes an amount of misregistration of the semiconductor substrate 1. On the basis of this computed misregistration amount, the control unit 55 controls the X-Y stage 23a to move x and/or y direction, so that the semiconductor substrate 1 is positioned at a predetermined position at high accuracy.

The semiconductor substrate 1 thus positioned is vacuum chucked by the vacuum chuck head 33 of the second transfer arm 33, and is then transferred onto the rotary table 29 of the etchant applying unit 24 at a high accuracy by actuating the pneumatic cylinder 48 and the pneumatic cylinder 54 in the same fashion as in the first transfer arm 32.

The rotary table 29 vacuum chucks the semiconductor substrate 1 placed on it, and is then rotated by the motor in the direction of the arrow A in FIG. 4, so that the semiconductor substrate 1 is rotated in unison with the rotary table 29 in the same direction. The applying roller 30 is horizontally moved together with the etchant feed tube 31 so that the tapered outer circumferential surface 1a of the semiconductor substrate 1 is received in a circumferential recess 30a of the applying roller 30. During this operation, the applying roller 30 is rotated by the other motor in the direction B. The etchant feed tube 31 supplies an etchant to the circumferential recess 30a of the applying roller 30, so that the etchant is uniformly applied over the tapered edge 1a of the semiconductor substrate 1 for etching. Then, the semiconductor substrate 1 is washed with pure water for initial purpose.

The semiconductor substrate 1 applied with the etchant is transferred from the rotary table 29 to the cleaning unit 25 with the third transfer arm 34 by actuating the pneumatic cylinder 54 and the pneumatic cylinder 49 in the same manner as in the arms 32 and 33. In the cleaning unit 25, the semiconductor substrate 1 is washed with water, and is then dried. Thereafter, the semiconductor substrate 1 is transferred from the cleaning unit 25 onto the hot plate 26a of the baking unit 26 with the fourth transfer arm 35 by actuating the pneumatic cylinder 54 and the pneumatic cylinder 50 in the same manner as in the arm 32.

The hot plate 26a dries the semiconductor substrate 1 at a high temperature. The fifth transfer arm 36 vacuum chucks the semiconductor substrate 1, which is on the hot plate 26a, and transfers it to a tray 28 in the semiconductor substrate recovery unit 27 by actuating the pneumatic cylinder 54 and the pneumatic cylinder 51 in the same manner as in the arm 32.

Although the description has been made about only one semiconductor substrate 1, the arms 32-36 and the units 22-27 synchronously performs functions previously described on respective semiconductor substrates. Thus, the operations previously described are continuously carried out.

What is claimed is:

1. A semiconductor substrate etching apparatus for etching a beveled outer edge of a semiconductor substrate, comprising:

a semiconductor substrate supply means for placing a tray, receiving a semiconductor substrate, therein;

registration means for registering a semiconductor substrate transferred from the semiconductor substrate supply means thereto, the registration means including: X-Y stage means for resting the semiconductor substrate transferred from the semiconductor substrate supply means thereon for positioning in an x-y coordinate system; and position detecting means for detecting a position in the x-y coordinate system of the semiconductor substrate rested on the X-Y stage means to produce a position detection signal;

etchant applying means including: a rotary table means for resting the semiconductor substrate, transferred from the registration means, thereon for rotation; and etchant applying means, arranged in the vicinity of the rotary table means, for applying an etchant to the tapered outer edge of the semiconductor substrate rested on the rotary table means;

cleaning means for cleaning the semiconductor substrate transferred from the rotary table means thereto and for drying the cleaned semiconductor substrate;

baking means including: hot plate means for resting a cleaned and dried semiconductor substrate, transferred from the cleaning means, thereon and for baking the cleaned and dried semiconductor substrate for drying;

semiconductor substrate recovering means for resting a tray to receive the baked semiconductor substrate, transferred from the baking means, thereon, the semiconductor substrate supply means, the X-Y stage means, the etchant applying means, the cleaning means, the baking means, and the semiconductor substrate recovering means being arranged in a horizontal plane in the described order;

transfer means for sequentially transferring the semiconductor substrate in the described order from the semiconductor substrate supply means to the semiconductor substrate recovering means; and control means for controlling the transfer means to perform the transferring of the semiconductor substrate and for controlling the X-Y stage means in response to the position detection signal for positioning the semiconductor substrate on the X-Y stage means.

2. A semiconductor substrate etching apparatus as recited in claim 1, wherein the transfer means comprises:

first carrying arm means for carrying the semiconductor substrate from the semiconductor substrate supply means to the X-Y stage means;

second carrying arm means for carrying the semiconductor substrate from the X-Y stage means to the rotary table means;

third carrying arm means for carrying the semiconductor substrate from the rotary table means to the cleaning means;

fourth carrying arm means for carrying the semiconductor substrate from the cleaning means to the hot plate means;

fifth carrying arm means for carrying the semiconductor substrate from the hot plate means to the semiconductor substrate recovering means; and reciprocating means for vertically movably interconnecting and for horizontally reciprocating the first to the fifth carrying arm means for performing the sequential transferring of the semiconductor substrate.

3. A semiconductor substrate etching appartus as recited in claim 2, wherein the reciprocating means comprises elevating means for elevating each of the first to the fifth carrying arm means.

4. A semiconductor substrate etching apparatus as recited in claim 3, wherein the reciprocating means holds the first to the fifth carrying arm means in a horizontally equi-spaced manner.

5. A semiconductor substrate etching apparatus as recited in claim 4, further comprising a single clean unit, and wherein the semiconductor substrate supply means, the X-Y stage means, the etchant applying means, the cleaning means, the baking means, and the semiconductor substrate recovering means are incorporated in the clean unit.

* * * * *